United States Patent [19]

Schoeff

[11] 4,292,625
[45] Sep. 29, 1981

[54] MONOLITHIC DIGITAL-TO-ANALOG CONVERTER

[75] Inventor: John A. Schoeff, Los Gatos, Calif.

[73] Assignee: Advanced Micro Devices, Inc., Sunnyvale, Calif.

[21] Appl. No.: 57,046

[22] Filed: Jul. 12, 1979

[51] Int. Cl.³ .................................................. H03K 13/05
[52] U.S. Cl. .................................................. 340/347 DA
[58] Field of Search .................................... 340/347 DA

[56] References Cited

U.S. PATENT DOCUMENTS

| | | | |
|---|---|---|---|
| 3,217,147 | 11/1965 | Chapman | 340/347 DA |
| 3,303,489 | 2/1967 | Krucoff | 340/347 DA |
| 3,305,857 | 2/1967 | Barber | 340/347 DA |
| 3,675,234 | 7/1972 | Metz | 340/347 DA |
| 3,961,326 | 6/1976 | Craven | 340/347 DA |
| 4,118,699 | 10/1978 | Comer | 340/347 DA |
| 4,141,004 | 2/1979 | Craven | 340/347 DA |

OTHER PUBLICATIONS

Maddox "Electronics", Apr. 4, 1974, pp. 125–130.

Primary Examiner—Charles D. Miller
Attorney, Agent, or Firm—J. Ronald Richbourg; Gary T. Aka

[57] ABSTRACT

A digital-to-analog converter is provided which converts a series of digital binary numbers into an analog signal having an amplitude proportional to the values of the binary numbers. The disclosed embodiment of this invention includes a segment generator having input terminals coupled to receive the most significant digits of the binary numbers to be converted, wherein the segment generator provides a first signal proportional to the values of the most significant digits of the binary numbers. A step generator is also included which receives the remaining lesser significant digits of the binary number and provides a second signal proportional to the values of these lesser significant digits of the same binary numbers. Additionally, means for combining the first and second signals is provided to form an analog signal proportional to the value of the binary number to be converted.

14 Claims, 6 Drawing Figures

MONOLITHIC DIGITAL-TO-ANALOG CONVERTER

BACKGROUND OF THE INVENTION

1. Field of the Invention

This invention generally relates to electronic circuits adapted for converting one form of an intelligence signal into another form, and more particularly to an inherently monotonic digital-to-analog converter.

2. Prior Art

In the early development phases of electronic circuitry, converters (such as a digital-to-analog converter) were built in large rack mounted units, first using vacuum tubes and later discrete transistors. As components became smaller and smaller, it was possible to put an entire converter on a printed circuit board. Later it was possible to place the converter in a smaller module surrounded by a potting compound. As integrated circuits became more powerful, converters were made with multiple integrated circuit chips including laser-trimmed thin-film resistors combined in a hybrid assembly. Such a prior art device is described in greater detail in an article entitled "An Integrated Circuit 12-Bit D/A Converter" by R. B. Craven, which article was published in the ISSCC Digest of Technical Papers at pages 40–41 in February, 1975.

More recently, monolithic converters have been fabricated with the use of thin-film resistors that are laser trimmed. For purposes of this description, "monolithic" refers to a single structure on a single semiconductor chip. Such a prior art device is described in greater detail in an article entitled "A High-Speed 12 Bit Monolithic D/A Converter" by R. W. Webb, which as published in the ISSCC Digest of Technical Papers at pages 142–143 in February, 1978.

Figure 1:
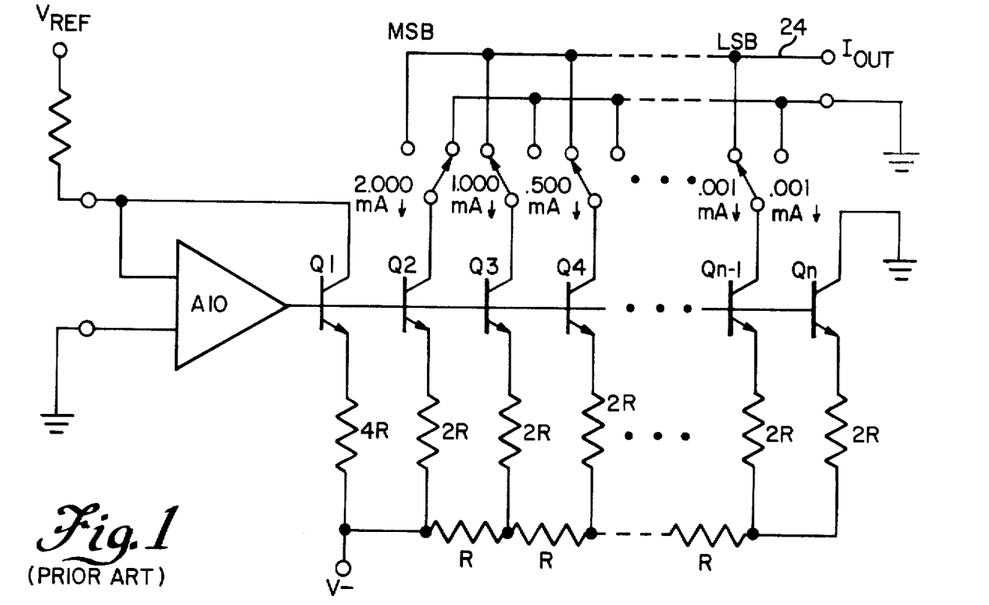
FIG. 1 is a schematic diagram of a prior art R-2R ladder network digital-to-analog converter.

With reference to FIG. 1, a schematic diagram of a typical prior art binary weighted R-2R ladder network digital-to-analog converter (DAC) is illustrated. Briefly, the output of an amplifier A10 is coupled to base terminals of a series of parallel-connected transistors (Q1, Q2, Q3, Q4 ... Qn−1, Qn) for providing the appropriate bias voltage. The emitter terminals of each of these transistors is coupled one side of a resistor 2R, and the second sides of these resistors are coupled together through additional resistors R. Thus, the name "R-2R". The collector terminal of these transistors are coupled to operating terminals of switches operative in response to the state of the binary inputs. For example, a switch will be set into one position for a digital one and into another position for a digital zero. One terminal of each of the switches is coupled to ground potential, and the second terminal is coupled to an output line 24 also referred to as $I_{out}$.

The ladder includes resistor "rungs" having a value of 2R and extensions having a value of R. This combination of rungs and extensions serves to divide the current in each rung by 50 percent of the preceding rung. For example, if the first three transistors are coupled to the $I_{out}$ output line 24 the current sourced by the first transistor will be twice the current sourced by the second transistor which in turn will be twice the current sourced by the third transistor and so on. Thus, if the first transistor sources 2 milliamps of current, the second transistor will source 1 milliamp, the third 0.5 milliamp, and so forth.

The prior art converter includes twelve binary-weighted current sources which are used in all possible binary combinations to produce 4,096 analog output levels. The main advantage of the R-2R structure is that it uses a minimum number of components that must match and track well over temperature. The most critical resistor in the circuit is the most significant bit (MBS) resistor coupled to the emitter terminal of Q2. If the full-scale current of this converter is 4 milliamps, then the MSB will be 2 milliamps and each succeeding bit will be divided by 2 all the way down to the least significant bit (LSB) transistor, which is one microamp. At a major carry transition point, the eleven least significant bits will be turned on to produce an output current of 1.999 milliamps for an input code of 011111111111. When the input code is incremented 1 count, becoming 100000000000, the lower order current sources turn off, and the MSB current source turns on to yield an output current of 2 milliamps. If this source has an error of more than −1 microamps, the converter will be non-monotonic. This corresponds to a resistor tolerance of 0.05 percent, which must be maintained over the entire operating temperature range. Even when the resistors match well, laser trimming can alter their tracking characteristics and affect yield over temperature. Even though it is possible to match diffused transistors to within plus or minus 0.05 percent, they are not really practical with the R-2R structure due to their high temperature coefficient, piezoresistance, and voltage coefficient.

One design approach that provides monotonicity without requiring high linearity is the MOS switch-resistor string. For purposes of this description, "monotonic" refers to a continuous function wherein the output increases for each increase in the digital input binary number. This circuit is actually a full complement to a current switched R-2R DAC structure since it is slower, has a voltage output, and if implemented at the twelve-bit level would use 4,096 low tolerance resistors rather than a minimum number of high tolerance resistors as in the R-2R structure. Such a prior art converter is described in greater detail in an article entitled "A Single Chip 8-Bit A/D Converter" by A. R. Hamade and E. Campbell, which was published in ISSCC Digest of Technical Papers at page 154 in February, 1976.

Another design approach that provides monotonicity with a non-linear function is described in a paper entitled "A Monolithic Companding D/A Converter." This paper was presented by the inventor hereof at the Telecommunications Circuit Techniques Session of the IEEE Solid-State Circuits Conference on Feb. 16, 1977, and is published at page 58 of the proceedings of this conference.

SUMMARY OF THE INVENTION

In accordance with this invention, a new digital-to-analog circuit is provided for converting a series of digital binary numbers into an analog signal having an amplitude proportional to the values of the binary numbers. Such a circuit comprises a segment generator having input terminals coupled to receive the most significant digits of the binary numbers to be converted, wherein the segment generator is disposed for providing a first signal proportional to the values of the most significant digits of the binary numbers. Further, a step generator is included which has input terminals coupled to receive the least significant digits of the binary numbers to be converted, wherein the step generator is disposed for providing a second signal proportional to the values of the least significant digits of the same binary numbers. Additionally, means for combining the first and second signals is provided to form an analog signal proportional to the value of the binary number to be converted.

DETAILED DESCRIPTION

Figure 2:
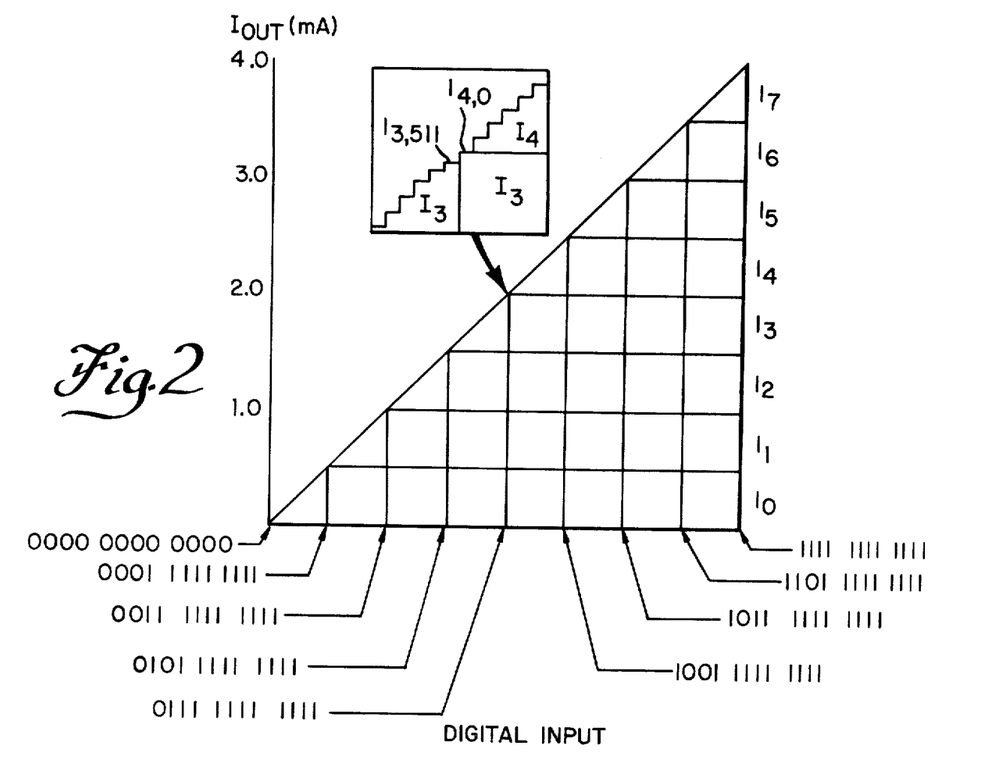
FIG. 2 is a graph illustrating the function of this invention in converting a digital binary number into an analog representation thereof.

The function of the output current of the circuit of this invention with respect to the digital input code (i.e., the transfer characteristic) is plotted in the diagram of FIG. 2. The current output is supplied at 4,096 discrete levels, which levels are partitioned into eight groups of 512 steps each. The key to the inherent monotonicity may be seen by examining the major carry function amplified in the inset of FIG. 2. Rather than switching in an entirely different current at the major carry as the R-2R converter does, the current from the segment prior to the major carry current $I_3$ is retained and the current to create additional steps is added to this current in the form of increments of current $I_4$. Thus, the converter is monotonic regardless of the relative slopes of the eight segments. The only critical resistor matching occurs at the major carries or midpoints of each of the eight segments, and the tolerances are equivalent to that of a 9-bit DAC, or eight times lower than the R-2R structure. Accordingly, the problem has been divided into eight separate problems each with tolerances eight times lower than that of a 12-bit DAC.

Table I below compares the resistor requirements of a 12-bit DAC built according to the prior art shown in FIG. 1, with the master-slave type of network described in a paper by D. T. Comer entitled "A Monolithic D/A Converter," which paper was published in the ISSCC Digest of Technical Papers of February 1977 at pages 104-105. Also, Table I compares the two prior art DAC's with a 12-bit segmented DAC built according to the teachings of this invention. The two prior art DAC's require 50% more resistors than does the segmented DAC, and the prior art resistors must match to within ±0.05% to guarantee monotonicity (defined as ±1LSB differential nonlinearity: DNL, a measurement of step uniformity). The remaining numbers in the table indicate resistor temperature tracking requirements. If the converter is perfect at room temperature, resistor tracking within ±5 parts per million per degree Celcius (or ±5 ppm/° C.) would maintain monotonicity from 25° C. to 125° C. Some allowance must be made for error, however, so if the initial DNL were ½ LSB, a ±2.5 ppm/° C. tracking figure would be necessary, which is difficult to maintain with almost any technology.

TABLE I

| Ladder Type | No. of Resistors | Initial Matching Required For ± 1 LSB DNL (%) | Tracking Required For ± 1 LSB DNL (PPM/°C.) 0 Initial DNL | ½ LSB Initial DNL | Tracking Req'd For + ¼ LSB DNL (PPM/°C.) ¼ LSB Initial DNL |
|---|---|---|---|---|---|
| Straight R-2R | 37 | ±.05 | 5 | 2.5 | 1.25 |
| Master-Slave 6 + 6 bits | 26/38 | ±.05 | 5 | 2.5 | 1.25 |
| Segmented 3 + 9 bits | 24 | ±.4 | 40 | 20 | 10 |

The segmented approach of the present invention requires only 24 resistors and the initial resistor matching is ±0.4 percent. Note that the numbers are relaxed by a factor of eight with respect to the R-2R ladder network. Typical diffused resistor tracking is on the order of ±2 ppm/° C., thus providing ample latitude for maintaining 13 bit differential linearity over the temperature range of 25° C. to 125° C. The tracking requirements over the temperature range of −55° C. to 25° C. are even less stringent since total temperature change is smaller.

Figures 3, 4:
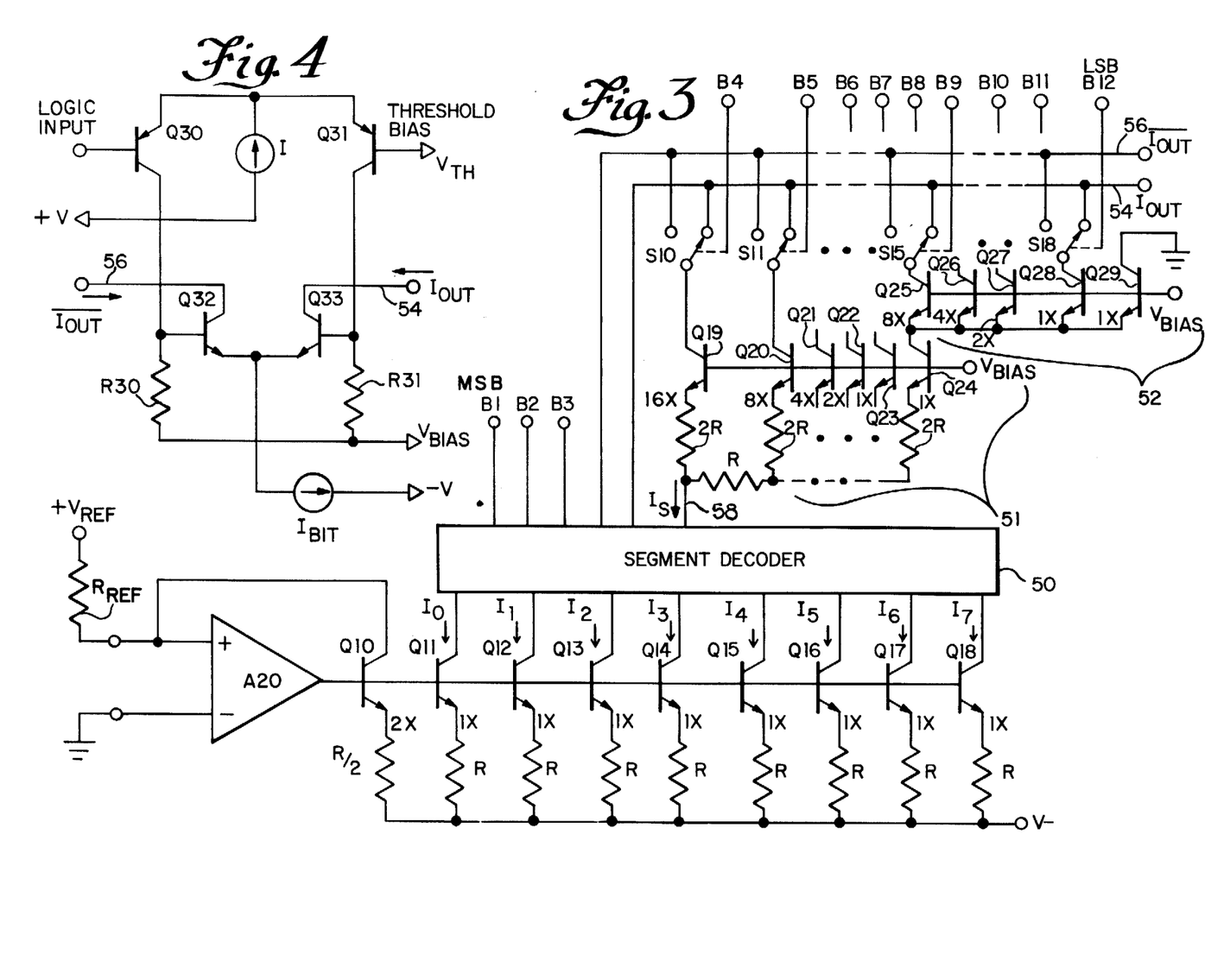
FIG. 3 is a schematic/block diagram of the converter in accordance with this invention.
FIG. 4 is a schematic diagram of a current switch within the step generator of this invention.

Referring now to FIG. 3, a schematic diagram of the 12-bit DAC of the present invention is illustrated in greater detail. This diagram is referred to herein as a "segmented" 12-bit DAC, since the transfer characteristic is divided into segments. The binary number to be converted to an analog signal is provided on terminals B1 through B12, wherein the MSB is provided on the terminal B1 and the LSB is provided on the terminal B12. The bit terminals B1, B2 and B3 are coupled to inputs of a segment decoder 50, the bit terminals B4 through B8 are coupled to inputs of a master ladder network 51, and the bit terminals B9 through B12 (the LSB) are coupled to inputs of a slave ladder network 52. The combination of the networks 51 and 52 is referred to herein as a step generator. In this embodiment, the analog output signal and its complement are supplied on lines 54 and 56, and the output signal is referred to herein as $I_{out}$, and its complement as $\overline{I_{out}}$.

The segment generator includes, in addition to the segment decoder 50, transistor Q10 through Q18 having base terminals thereof coupled to the output of an amplifier A20. The transistors Q11 through Q18 form current sources $I_0$ through $I_7$ coupled to the segment decoder 50. The relative scaling of the emitters of the transistors illustrated and described herein are noted by a number followed by an X. For example, the emitter of the transistor Q10 is twice the size of that of the emitter of the transistor Q11, hence a 2X adjacent Q10 notes this fact.

The master ladder network 51 includes transistors Q19 through Q24, and is coupled to the segment decoder 50 at the emitter terminal of the transistor Q19 by means of a line 58. The segment current $I_s$ is supplied to the step generator by means of the line 58. The slave ladder network 52 includes transistors Q25 through Q29. The ladder networks 51 and 52 (or step generator) form a conventional R-2R ladder network with a remainder divider network similar to that described in U.S. Pat. No. 4,055,773. Switches S10 through S18 are schematic represtations of current switches (to be explained further hereinbelow), which is operative in response to the presence of a binary signal (one or a zero) supplied on the terminals B4 through B12, respectively. A binary one will operate the switch to a second position.

The master ladder network 51 converts the bits B4 through B8 into an analog signal by means of a conventional R-2R ladder, which signal is supplied on the output lines 54 and 56. A remainder current is supplied to the slave ladder network 52 by the collector of Q24 at the emitter of Q25, which remainder current is divided by active current splitting into the four (4) least significant bits. This arrangement minimizes the range of emitter scaling necessary to generate nine binarily weighted currents. Furthermore, note that the ladder resistors in the lower order bits (B9 through B12) have been eliminated because the tolerance for error as a percent of the bit current value is much higher. Such resistors would not be useful anyway, since the voltage drop across them would be very small.

For a given 3-bit code at the input of the segment decoder 50, a segment current $I_s$ (e.g., $I_3$) is selected and fed to the step generator where it is divided into 512 discrete levels. All the lower order segments (i.e., $I_0$, $I_1$, and $I_2$) are coupled to the output line 54 and summed with the step generator output signal, and all the higher order segments (i.e., $I_4$ through $I_7$) are fed to the differential output line 56 (or $\overline{I_{out}}$) which for purposes of the present description can be thought of as ground potential. At a segment carry as shown by the inset of FIG. 2, the input code is 011111111111, and 511 of the 512 levels of the step generator appear on the output line 54. The 512th level is the remainder current, which is coupled to ground potential. When the binary code is incremented by one count the current $I_3$ is switched away from the step generator and fed to the $I_{out}$ output line 54, taking the remainder current with it. Thus, the output of the DAC increases by one LSB and is inherently monotonic at the segment carries. The segment carries do not depend on resistor matching at all. The most critical resistor in the circuit is now the emitter resistor of the transistor Q19, and its tolerance is eight times lower than that of the traditional R-2R ladder network, which allows monotonicity to be achieved in the step generator without the trimming of the resistors. Accordingly, it may be appreciated that the circuit of this invention is tolerant of component mismatches of the order commonly encountered in semiconductor devices. Hence, the circuit of this invention can be built on a single semiconductor chip, or is monolithic.

The currents in the step generator are switched with fully differential current switches (schematically represented by switches S10 through S18) capable of switching a one microamp current in about 30 nanoseconds. The high speed current switch is shown in greater detail in FIG. 4. A pair of PNP transistors Q30 and Q31 have their emitter terminals connected together and this connection is coupled to a positive voltage source (+V) through a current source I. The base terminal of the transistor Q30 is coupled to the logic input terminal (e.g., one of the terminals B4-B12).

The collector terminal of the transistor Q30 is coupled to one side of the resistor R30 and to the base terminal of the NPN transistor Q32. The collector terminal of the transistor Q32 is coupled to the output line 56. The base terminal of the transistor Q31 is coupled to a threshold bias voltage, and the collector terminal thereof is coupled to the base terminal of a second NPN transistor Q33 and to one side of a resistor R31. The collector terminal of the transistor Q33 is coupled to the output line 54. The emitter terminals of the transistors Q32 and Q33 are connected together and this connection is coupled to a minus voltage supply ($-V$) through a current source $I_{bit}$. The second side of the resistors R30 and R31 are connected together and this connection is coupled to a bias voltage supply ($V_{bias}$).

High speed operation is possible because the common emitter connection of the NPN differential pair (Q32 and Q33) remains at the same voltage regardless of the logic state and the bit current need not charge or discharge the parasitic capacitance at this node. For a capacitance of 2 picofarads, a single-ended switch which swings 0.7 volts would require 1.4 microseconds to turn on the one microamp LSB. The use of such a switch as illustrated in FIG. 4 makes possible the high voltage compliance, high impedance and the complementary output ($I_{out}$, $\overline{I_{out}}$). That is, the output signals $I_{out}$ and $\overline{I_{out}}$ are analog complements of each other, which means that $I_{out}$ increases as $\overline{I_{out}}$ decreases with an increasing digital input code. The sum of the two output signals is equal to the full-scale current regardless of the input code. Another advantage of the differential current switch of FIG. 4 includes adjustable logic threshold by varying the base bias on Q31 to be compatible with such popular logic types as CMOS, ECL, HTL etc. Also, a logic input range is possible which swings from below ground potential up to and above the positive power supply voltage. Furthermore, level shifting is permissible independent of the positive or the negative power supply voltage.

Figure 5:
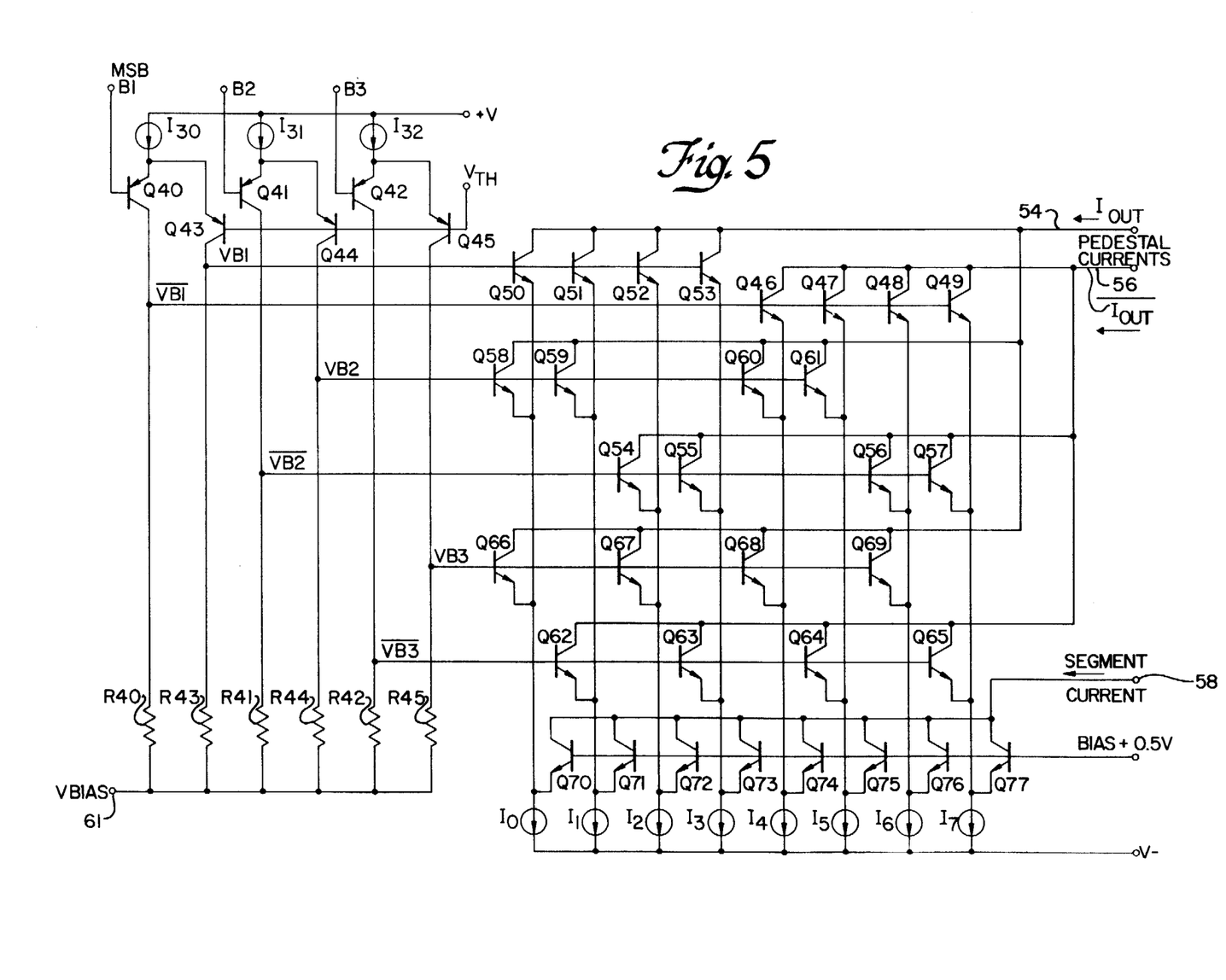
FIG. 5 is a schematic diagram of the segment decoder of this invention.

Referring now to FIG. 5, the segment decoder 50 is illustrated in greater detail. The three most significant digits of the binary number to be converted are supplied on the terminals B1, B2 and B3, which are coupled to the base terminals of transistors Q40, Q41 and Q42, respectively. The emitter terminals of the transistors Q40, Q41 and Q42 are coupled to current sources $I_{30}$, $I_{31}$ and $I_{32}$, respectively. In addition, the emitter terminals of the transistors Q40, Q41 and Q42 are coupled to emitter terminals of transistors Q43, Q44 and Q45, respectively. The base terminals of the transistors Q43, Q44 and Q45 are connected together and this connection is coupled to a threshold voltage input terminal $V_{th}$, which is typically +1.4 volts. The current sources $I_{30}$, $I_{31}$ and $I_{32}$ are designed to provide typically 200 microamps each. The collector terminals of the transistors Q40, Q41 and Q42 are coupled to a bias voltage supply on a terminal 61 through resistors R40, R41 and R42; and, each of the collector terminal connections is referred to as $\overline{VB1}$, $\overline{VB2}$ and $\overline{VB3}$, respectively. In a similar manner, the collector terminals of the transistors Q43, Q44 and Q45 are coupled to the same bias voltage terminal 61 through resistors R43, R44 and R45; and, similarly, each of these collector terminal connectons is referred to as VB1, VB2 and VB3. Moreover, the $\overline{VB1}$ terminal is coupled to the base terminals of 4 parallel-connected transistors Q46 through Q49. The collector terminals of the transistors Q46 through Q49 are connected together and this connection is coupled to the output line 56. The emitter terminals of transistors Q46 through Q49 are coupled to current sources $I_4$ through $I_7$, respectively.

In a similar manner, the VB1 terminal of the transistor Q43 is coupled to base terminals of four parallel transistors Q50 through Q53. The collector terminals of the transistors Q50 through Q53 are connected together and this connection is coupled to the output line 54. The emitter terminals of the transistors Q50 through Q53 are coupled to current sources $I_0$ through $I_3$. Accordingly, it may be seen that the turning on of the transistors Q46 through Q49 couple the current sources $I_4$ through $I_7$ to the output line 56. In a like manner, the turning on of the transistors Q50 through Q53 couple the current sources $I_0$ through $I_3$ to the output line 54. Note further that the turning on of the transistors Q46 through Q49 is mutually exclusive of the turning on of the transistors Q50 through Q53 since the collector of Q43 is VB1 and the collector of Q40 is $\overline{VB1}$, its complement.

The $\overline{VB2}$ terminal is coupled to base terminals of transistors Q54 through Q57. The collector terminals of the transistors Q54 through Q57 are connected together and this connection is coupled to the output line 56. The emitter terminals of the transistors Q54 and Q55 are coupled to the current sources $I_2$ and $I_3$, respectively. The emitter terminals of the transistors Q56 and Q57 are coupled to the current sources $I_6$ and $I_7$.

The VB2 terminal is connected to base terminals of the transistors Q58 through Q61 are connected to the output line 54. The emitter terminals of the transistor pair Q58 and Q59 are coupled to the current sources $I_0$ and $I_1$, respectively. The emitter terminals of the transistor pair Q60 and Q61 are coupled to the current sources $I_4$ and $I_5$, respectively. The $\overline{VB3}$ terminal is similarly connected to base terminals of transistors Q62 through Q65. Furthermore, the collector terminals of the transistors Q62 through Q65 are coupled to the output line 56, and the emitter terminals of these transistors are coupled to current sources $I_1$, $I_3$, $I_5$ and $I_7$, respectively. The VB3 terminal is coupled to base terminal of parallel connected transistors Q66 through Q69. The collector terminals of the transistors Q66 through Q69 are connected together and this connection is coupled to the output line 54. The emitter terminals of these same transistors are coupled to the current sources $I_0$, $I_2$, $I_4$ and $I_6$, respectively.

The three transistors pairs Q40-Q43, Q41-Q44 and Q42-Q45 form three segment switch drivers which perform the function of switching eight precision current sources $I_0$ through $I_7$ in proper priority to three analog outputs on lines 54, 56 and 58 in response to three digital input signals on the terminals B1, B2 and B3. The nodes VB1, VB2 and VB3 at the collector terminals of the transistors Q43, Q44 and Q45, respectively, have three separate high levels which are spaced 0.5 volts apart. Including the low level of each node there are a total of four logic levels. Accordingly, this adds an extra dimension to the switch matrix which simplifies it considerably. The logic levels for the current switches are ranked according to the significance of each input bit.

In accordance with one embodiment of this invention that has been reduced to practice, the resistors R40 and R43 are 10 Kohms; the resistors R41 and R44 are 7.5 Kohms; and, the resistors R42 and R45 are 5 Kohms. Also a VBIAS of −10 volts is applied to the terminal 61.

In operation, the group of transistors Q50 through Q53 is capable of overriding all transistors beneath them (higher IR drop across resistors R40 and R43) so that when the MSB (B1) is high the current sources $I_0$ through $I_3$ will be coupled to the output line 54. For any given input code, seven of the eight current sources will be switched to the output pair of lines 54 and 56, and the eighth current source will be coupled to the master-slave ladder network at the segment current ($I_s$) output on the line 58.

The Table II below summarizes the relationship between the states of the logic inputs B1, B2 and B3, and the voltages developed on the nodes VB1, $\overline{VB1}$, VB2, $\overline{VB2}$, VB3 and $\overline{VB3}$. The individual voltages tabulated are given with respect to the value of VBIAS. For example, with a logic input of 110, the voltage on the node VB1 is equal to VBIAS+2 volts, the voltage on the node $\overline{VB1}$ is equal to VBIAS+0 volts, etc.

TABLE II

| LOGIC INPUT | VB1 | $\overline{VB1}$ | VB2 | $\overline{VB2}$ | VB3 | $\overline{VB3}$ |
|---|---|---|---|---|---|---|
| 111 | +2V | +0V | +1.5V | +0V | +1.0V | +0V |
| 110 | +2V | +0V | +1.5V | +0V | +0V | +1.0V |
| 101 | +2V | +0V | +0V | +1.5V | +1.0V | +0V |
| 100 | +2V | +0V | +0V | +1.5V | +0V | +1.0V |
| 011 | +0V | +2V | +1.5V | +0V | +1.0V | +0V |
| 010 | +0V | +2V | +1.5V | +0V | +0V | +1.0V |
| 001 | +0V | +2V | +0V | +1.5V | +1.0V | +0V |
| 000 | +0V | +2V | +0V | +1.5V | +0V | +1.0V |

The Table III below summarizes the relationship between the states of the logic inputs B1, B2 and B3, and the routing of the currents from the current sources $I_0$ through $I_7$. The tabulated symbols are $I_s$ for the segment current supplied on the line 58, $I_0$ for the output current $I_{out}$ supplied on the line 54, and $\overline{I_0}$ for the output current $\overline{I_{out}}$ supplied on the line 56.

TABLE III

| LOGIC INPUT | | | | | | | | |
|---|---|---|---|---|---|---|---|---|
| 111 | $I_0$ | $I_0$ | $I_0$ | $I_0$ | $I_0$ | $I_0$ | $I_0$ | $I_s$ |
| 110 | $I_0$ | $I_0$ | $I_0$ | $I_0$ | $I_0$ | $I_0$ | $I_s$ | $\overline{I_0}$ |
| 101 | $I_0$ | $I_0$ | $I_0$ | $I_0$ | $I_0$ | $I_s$ | $\overline{I_0}$ | $\overline{I_0}$ |
| 100 | $I_0$ | $I_0$ | $I_0$ | $I_0$ | $I_s$ | $\overline{I_0}$ | $\overline{I_0}$ | $\overline{I_0}$ |
| 011 | $I_0$ | $I_0$ | $I_0$ | $I_s$ | $\overline{I_0}$ | $\overline{I_0}$ | $\overline{I_0}$ | $\overline{I_0}$ |
| 010 | $I_0$ | $I_0$ | $I_s$ | $\overline{I_0}$ | $\overline{I_0}$ | $\overline{I_0}$ | $\overline{I_0}$ | $\overline{I_0}$ |
| 001 | $I_0$ | $I_s$ | $\overline{I_0}$ | $\overline{I_0}$ | $\overline{I_0}$ | $\overline{I_0}$ | $\overline{I_0}$ | $\overline{I_0}$ |
| 000 | $I_s$ | $\overline{I_0}$ | $\overline{I_0}$ | $\overline{I_0}$ | $\overline{I_0}$ | $\overline{I_0}$ | $\overline{I_0}$ | $\overline{I_0}$ |
| | $I_0$ | $I_1$ | $I_2$ | $I_3$ | $I_4$ | $I_5$ | $I_6$ | $I_7$ |

Figure 6:
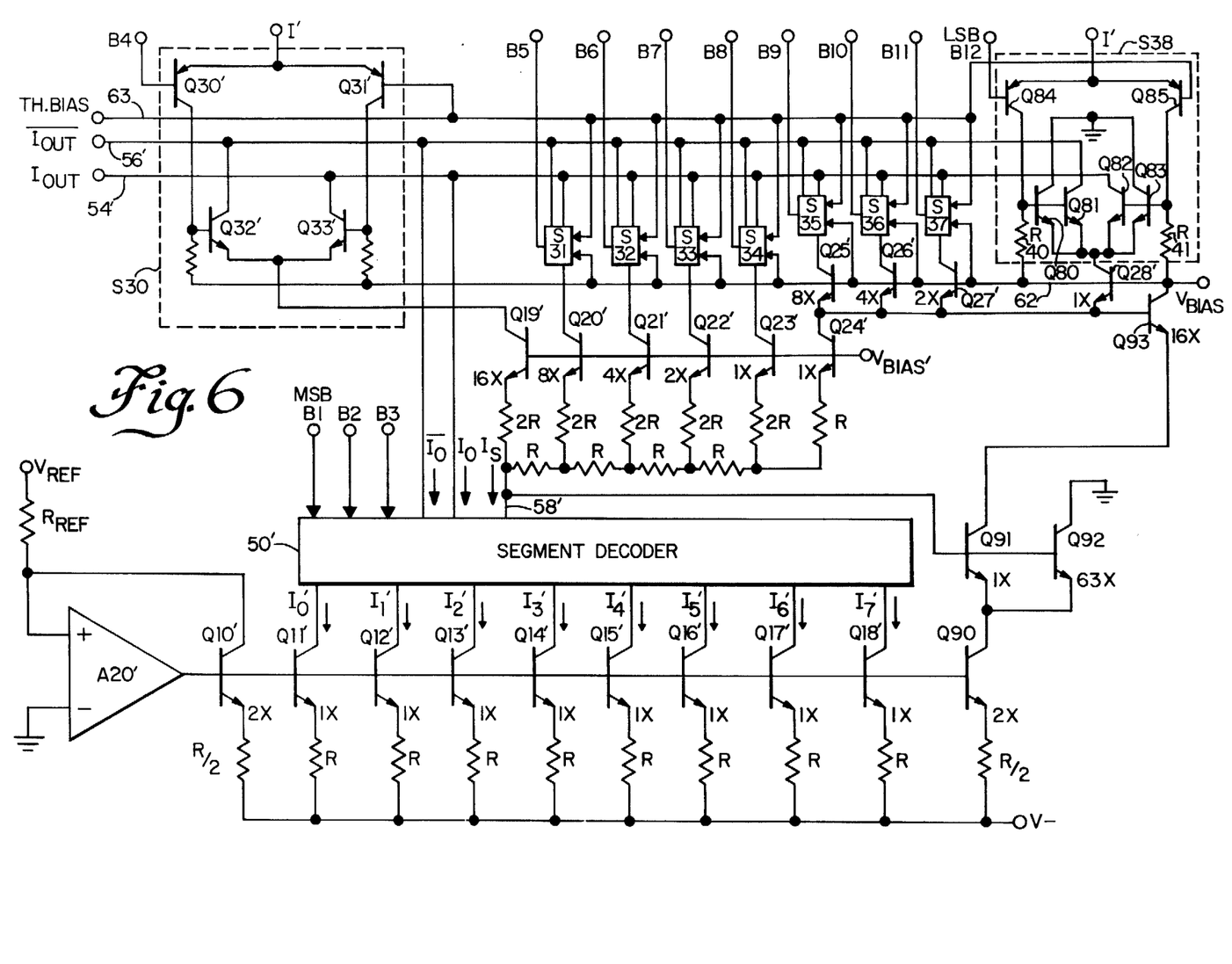
FIG. 6 is a schematic diagram of an alternate embodiment of this invention.

Another embodiment of this invention is illustrated in FIG. 6, wherein like reference numerals with a prime identify like components or parts described and illustrated hereinabove. As in the circuit shown in FIG. 3, and described hereinabove, the three MSB's B1, B2 and B3 are coupled to three inputs of the segment decoder 50'. Current sources $I_0'$ through $I_7'$ are likewise connected to the segment decoder 50' in the same fashion. Further, the output lines 54', 56', and 58' are also connected to the decoder 50' for providing $I_{out}$, $\overline{I_{out}}$ and $I_s$, respectively. The base and emitter terminals of Q19' through Q24' are likewise connected as described above with reference to FIG. 3; however, the collector terminals of the transistors Q19' through Q23' are connected to current switches S30 through S34, which switches are similar to the circuit shown in FIG. 4 and described above. The collector terminal of the transistor Q24' is connected to the emitter terminals of the transistors Q25' through Q28'.

A detailed schematic of the switch S30 is shown connected to the collector terminal of the transistor Q19', while blocks are used to represent the same switch circuit connected to the collector terminals of the transistors Q20' through Q23'. Similarly, switches S35 through S38 are coupled to the collector terminals of the transistors Q25' through Q28'. Note that the transistor Q29 (FIG. 3) has been eliminated in the embodiment shown in FIG. 6, and that the switch S38 is arranged differently from the other current switches. The switches S30 through S37 are arranged identically with the switch illustrated in FIG. 4 and described above. Moreover, like reference numerals with a prime identify components of the switch S30 that correspond to like components of the FIG. 4 switch schematic. The emitter terminals of the transistors Q32' and Q33' are connected together and this connection is coupled to the collector terminal of the transistor Q19', which in FIG. 4 is identified as the current source $I_{BIT}$.

The switch S38, on the other hand, includes six transistors Q80 through Q85, wherein the emitters of Q80 through Q83 are coupled to the collector terminal of the transistor Q28'. The collector terminals of Q80 and Q83 are connected together and this connection is coupled to ground potential so as to shunt the remainder current to ground. The collector terminal of the transistor Q81 is coupled to the $\overline{I_{out}}$ output line 56' and the collector terminal of the transistor Q82 is coupled to the $I_{out}$ output line 54'. The base terminals of the transistors Q80 and Q81 are connected together and this connection is coupled to the collector terminal of the transistor Q84 and to one side of a resistor R40. The second side of the resistor R40 is coupled to the $V_{BIAS}$ line 62. The emitter terminals of the transistors Q84 and Q85 are connected together and this connection is coupled to +V through current source I' in the same manner as the emitter terminals of Q30 and Q31 shown in FIG. 4 are connected. In a similar manner, the base terminals of the transistors Q82 and Q83 are connected together and this connection is coupled to the collector terminal of the transistor Q85 and to one side of a resistor R41. The second side of the resistor R41 is coupled to the $V_{BIAS}$ line 62. The base terminal of the transistor Q85 is coupled to the threshold bias line 63, and the base terminal of the transistor Q84 is coupled to the LSB logic input bit B12.

In order to compensate for a base current loss in the transistors Q19' through Q24' of the step generator, an additional current source circuit is employed in this embodiment. This circuit includes a transistor Q90 coupled in parallel with the transistors Q10' through Q18', a transistor pair Q91 and Q92 coupled in parallel between the collector terminal of the transistor Q90 and the emitter terminal of another transistor Q93. The base terminals of Q91 and Q92 are connected together and this connection is coupled to the segment current ($I_s$) line 58' so as to provide the compensating base current. The emitter terminals of Q91 and Q92 are connected together at the collector terminal of Q90, and the collector terminal of Q92 is grounded. The collector terminal of Q91 is coupled to the emitter terminal of Q93, and the base terminal of Q93 is coupled to the emitter terminal of Q28' so as to provide a compensating base current to the transistors Q25' through Q28'. If such base current loss compensation were not used, an error would occur in the output signal.

It may be appreciated from the discussion hereinabove that a monolithic digital-to-analog converter has been described in detail. Thus, while the invention has been particularly shown and described with reference to only two emodiments, it will be understood by those skilled in the art that the foregoing and other changes in form and details may be made without departing from the spirit and scope of the invention. Accordingly, it is intended that the present invention only be limited by the claims set forth hereinbelow.

I claim:

1. An apparatus for converting binary number signals into an analog signal comprising:

a segment generator including a first set of N input terminals disposed for receiving N binary bit signals representing the most significant bits of a binary number of M bits to be converted, wherein N and M are integers, first, second and complementary output terminals, $2^N$ equal current sources, N switching means, each coupled to one of said first set of input terminals and for generating a true logic output signal or a complementary logic output signal at a voltage level associated with the significance of said binary bit responsive to the signal upon said input terminal, N sets of true and complementary current switches, each true current switch capable of coupling one of said current sources to said first output terminal in response to a true output signal, each complementary current switch capable of coupling one of said current sources to said complementary output terminal in response to a complementary output signal, each of said current switches further responsive to the voltage level of said true or complementary output signal so that a first current switch coupling one of said current sources in response to a true or complementary output signal of a more significant binary bit overrides a second current switch capable of coupling said one current source in response to a true or complementary output signal of a less significant binary bit, each set having $2^N$ current switches coupled to one of said switching means, said sets of current switches arranged with respect to each other and said current sources so that for any combination of said N binary bit signals all but one of said current sources being coupled to said first or complementary output terminals and the number of current sources being coupled to said first output terminal increases by one as the value of said most significant binary bits increases by one, and means for coupling to said second output terminal said one current source not coupled to said first or complementary output terminals;

a step generator circuit including a second set of input terminals disposed for receiving the remaining M-N of the binary bit signals of the binary number to be converted, a step generator input terminal coupled to said second output terminal of said segment generator, means for dividing the current supplied to said step generator input terminal into a plurality of individual currents, and means for coupling certain ones of said individually divided currents selected as a function of the magnitude of the binary number to a step generator output terminal; and means for combining the current provided at said first output terminal of said segment generator with the current provided at said output terminal of said step generator so as to form a combined analog signal having an amplitude proportional to the value of the binary number to be converted.

2. An apparatus as in claim 1 further characterized by said current switches comprising transistors having emitter terminals coupled to corresponding ones of said current sources, collector terminals coupled to first or complementary output terminals and base terminals coupled to said switching means.

3. An apparatus as in claim 1 wherein said means for coupling to said second output terminal said current source not coupled to said first or complementary output terminals further comprises a set of $2^N$ current switches coupled to a bias signal source, each current switch capable of coupling one of said current sources to said second output terminal in response to said bias signal, said bias signal at a voltage level with respect to said voltage levels of said true or complementary logic output signals such that a current switch coupling one of said current sources in response to a true or complementary output signal from one of said switching means overrides a current switch capable of coupling said one current source in response to said bias signal, whereby only said current source not coupled to said first or complementary output terminals is coupled to said second output terminal.

4. An apparatus as in claim 3 wherein each of said means for coupling current switches comprises a transistor having an emitter terminal coupled to one of said current sources, a collector terminal coupled to said second output terminal and a base terminal coupled to said bias signal source.

5. An apparatus as in claim 1 wherein each of said switching means further comprises a pair of transistors having emitter terminals coupled to a switching means current source, a collector terminal of the first transistor of said pair coupled to true current switches of a set, a collector terminal of the second transistor of said pair coupled to complementary current switches of said set, a base terminal of said first transistor coupled to a first bias voltage supply and a base terminal of said second transistor coupled to one of said first set of input terminals.

6. An apparatus as in claim 5 wherein said collector terminals of said transistor pair further being coupled to a second bias voltage supply through a pair of equal value resistors whereby the value of said resistors determine the voltage level for the generated true or complementary logic output signal of said switching means.

7. An apparatus as in claim 5 wherein each of said true current switches comprises a transistor having an emitter terminal coupled to one of said current sources, a collector terminal coupled to said first output terminal and a base terminal coupled to a collector terminal of a first transistor of one of said switching means, and wherein each of said complementary current switches comprises a transistor having an emitter terminal coupled to one of said current sources, a collector terminal coupled to said complementary output terminal and a base terminal coupled to a collector terminal of a second transistor of one of said switching means.

8. An apparatus for converting binary number signals into an analog signal comprising:

a segment generator including a first set of first, second and third input terminals disposed for receiving three binary bit signals representing the most significant bits of a binary number of M bits to be converted, said first input terminal receiving the signal associated with the most significant bit, said second input terminal receiving the signal associated with the next most significant bit, and said third terminal receiving the signal associated of the least most significant bit of the three, true, complementary and third output terminals, eight equal current sources first, second and third switching means respectively coupled to said first, second and third input terminals, each switching means responsive to the binary bit signal upon its coupled input terminal for generating a true or complementary logic output signal, first, second and third sets of true and complementary current switches respectively coupled to said first, second and third switching means, each true current switch capable of coupling one of said current sources to said true output terminal in response to a true output signal, each complementary current switch capable of coupling one of said current sources to said complementary output terminal in response to a complementary output signal, each current switch of said first set coupling one of said current sources overriding any current switch of said second and third sets capable of coupling said one current source, each current switch of said second set coupling another one of said current sources overriding any current switch of said third set capable of coupling said another one current source, said sets of current switches arranged with respect to each other and said current sources so that for any combination of said three binary bit signals all but one of said current sources being coupled to said true or complementary output terminals and the number of current sources being coupled to said true output terminal increases by one as the value of said most significant binary bits increases by one, and means for coupling said one current source not coupled to said first or complementary output terminals to said third output terminal;

a step generator including a second set of input terminals disposed for receiving the remaining M-3 of the binary signals of the binary number to be converted, a step generator input terminal coupled to said third output terminal of said segment generator, means for dividing the current supplied to said step generator input terminal into a plurality of individual currents of differing magnitudes, and means for coupling certain ones of said individually divided currents selected as a function of the magnitude of the binary number to a step generator output terminal; and means for combining the current provided at said true output terminal of said segment generator with the current provided at said output terminal of said step generator so as to form a combined analog signal having an amplitude proportional to the value of the binary number to be converted.

9. An apparatus as in claim 8 further characterized by true current switches of said first set being coupled to first, second, third and fourth current sources of said eight equal current sources, complementary current switches of said first set being coupled to fifth, sixth, seventh and eighth current sources of said eight equal current sources, true current switches of said second set being coupled to said first, second, fifth and sixth current sources, complementary current switches of said second set being coupled to said third, fourth, seventh and eighth current sources, true current switches of said third set being coupled to said first, third, fifth and seventh current sources, and complementary current switches of said third set being coupled to said second, fourth, sixth and eighth current sources.

10. An apparatus as in claim 9 wherein said means for coupling to said third output terminal said one current source not coupled to said first or complementary output terminals further comprises eight current switches, each coupled to one of said equal current sources, each current switch of said first, second and third sets coupling one of said current sources to said true or complementary output terminals overriding any current switch of said means for coupling whereby all but one current switch of said means for coupling being overridden, which one current source being coupled to said third output terminal.

11. An apparatus as in claim 10 wherein each of said switching means further comprises a pair of transistors having emitter terminals coupled to a switching means current source, a collector terminal of the first transistor of said first pair coupled to true current switches of a set, a collector terminal of second transistor of said pair coupled to complementary current switches of said set, a base terminal of said first transistor coupled to a first bias voltage supply and a base terminal of said second transistor coupled to one of said input terminals.

12. An apparatus as in claim 11 further characterized by said collector terminals of said transistor pair of said switching means further being coupled to a second bias voltage supply through a pair of equal value resistors whereby the value of said resistors determine a voltage level for the generated true or complementary logic output signal, the value of said resistors selected so that the voltage level of each switching means being associated with the significance of the binary bit signal upon its coupled input terminal.

13. An apparatus as in claim 12 wherein
each of said true current switches comprises a transistor having an emitter terminal coupled to one of said current sources, a collector terminal coupled to said true output terminal, a base terminal coupled to a collector terminal of a first transistor of one of said switching means,
each of said complementary current switches comprises a transistor having an emitter terminal coupled to one of said current sources, a collector terminal coupled to said complementary output terminal, a base terminal coupled to a collector terminal of a second transistor of one of said switching means,
each current switch of said means for coupling comprises a transistor having an emitter terminal coupled to one of said current sources, a collector terminal coupled to said third output terminal, and a base terminal coupled to a bias signal voltage source, said bias signal voltage at a voltage level with respect to the voltage levels of said switching means so that a current switch of said first, second and third sets coupling one of said current sources overrides a means for coupling current switch capable of coupling said one current source to said third output terminal.

14. An apparatus for converting binary number signals into an analog signal comprising:

a segment generator including
a first set of N input terminals disposed for receiving N binary bit signals representing the most significant bits of a binary number of M bits to be converted, wherein N and M are integers,
first, second and complementary output terminals,
$2^N$ equal current sources,
N switching means, each coupled to one of said first set of input terminals and for generating a true logic output signal or a complementary logic output signal at a voltage level associated with the significance of said binary bit responsive to the signal upon said input terminal,
N sets of true and complementary current switches, each true current switch capable of coupling one of said current sources to said first output terminal in response to a true output signal, each complementary current switch capable of coupling one of said current sources to said complementary output terminal in response to a complementary output signal, each of said current switches further responsive to a voltage level of said true or complementary output signal so that a first current switch coupling one of said current sources in response to a true or complementary output signal of a more significant binary bit overrides a second current switch capable of coupling said one current source in response to a true or complementary output signal of a less significant binary bit, each set having $2^N$ current switches coupled to one of said switching means, a first half being true current switches and a second half being complementary current switches, said sets of current switches arranged with respect to each other and said current sources so that for any combination of said N binary bit signals all but one of said current sources being coupled to said first or complementary output terminals and, as the value of said most significant binary bits increases by one, the uncoupled one of said current sources being coupled to said first output terminal, and
means for coupling the uncoupled one of said current sources to said second output terminal;
a step generator circuit including
a second set of input terminals disposed for receiving the remaining M–N of the binary bit signals of the binary number to be converted,
a step generator input terminal coupled to said second output terminal of said segment generator,
means for dividing the current supplied to said step generator input terminal into a plurality of individual currents, and
means coupling certain ones of said individually divided currents selected as a function of the magnitude of the binary number to an step generator output terminal; and
means for combining the current provided at said first output terminal of said segment generator with the current provided at said output terminal of said step generator so as to form a combined analog signal having an amplitude proportional to the value of the binary number to be converted.

* * * * *